United States Patent [19]

Fowks

[11] Patent Number: 4,479,096
[45] Date of Patent: Oct. 23, 1984

[54] VOLTAGE VARIABLE CRYSTAL CONTROLLED OSCILLATOR

[75] Inventor: William R. Fowks, Yorba Linda, Calif.

[73] Assignee: Rockwell International Corporation, El Segundo, Calif.

[21] Appl. No.: 285,199

[22] Filed: Jul. 20, 1981

[51] Int. Cl.$^3$ .................. H03B 5/36; H03L 1/04; H03L 7/26
[52] U.S. Cl. ........................ 331/3; 331/69; 331/70; 331/94.1; 331/116 R; 331/116 FE; 331/176
[58] Field of Search .......... 331/3, 94.1, 68, 69, 331/70, 116 R, 116 FE, 158, 176

[56] References Cited

U.S. PATENT DOCUMENTS 4,001,724  1/1977  Keller ..................... 331/116 R
4,068,462  1/1978  Duff et al. ................ 331/158 X

FOREIGN PATENT DOCUMENTS 107341  8/1980  Japan ........................ 331/3

OTHER PUBLICATIONS

Nelson-Jones, L., "Crystal Oven and Frequency Standard" Wireless World, Jun., 1970, pp. 269-273.
Anon, "The Goral Oscillator" Radio Communication, V. 52, N. 5, pp. 359-360, May, 1976.

Primary Examiner—Siegfried H. Grimm
Assistant Examiner—W. R. Paxman
Attorney, Agent, or Firm—H. Fredrick Hamann; Richard A. Bachand

[57] ABSTRACT

A highly stable voltage variable crystal controlled oscillator adapted for stand-alone use or for use with an atomic clock for further stabilizing the oscillator. A novel Colpitts crystal oscillator configuration is employed and utilizes an FET amplifier and bipolar emitter follower configured for power gain without phase shift in the feedback circuit. The oscillator output signal is derived through the crystal which then acts as its own low pass filter to improve the purity of the output signal. A novel buffer/amplifier circuit including a grounded gate FET amplifier and coupling transformer assure frequency stability despite wide ranging load impedance variations. A resilient thermal foam material is used to enclose the temperature and shock sensitive components of the oscillator to provide further frequency stability and rugged construction.

16 Claims, 9 Drawing Figures ing a crystal oscillator would be for nought unless the

VOLTAGE VARIABLE CRYSTAL CONTROLLED OSCILLATOR

BACKGROUND OF THE INVENTION

1. Field of the Invention

The present invention relates to highly stable frequency sources and more particularly, to an improved voltage controlled crystal oscillator particularly adaptable for being stabilized by an atomic frequency standard.

2. Prior Art

Although the present invention may find practical application as a stand-alone oscillator or as an atomic frequency standard stabilized oscillator in any one of numerous atomic stabilized frequency sources, it is particularly adaptable for operation in a rubidium vapor cell frequency standard. Rubidium vapor cell frequency standards as well as other types of atomic stabilized frequency sources are described extensively in the literature. For example, reference may be had to the texts respectively entitled "Frequency and Time" by P. Kartaschoff, Academic Press, 1978; and "Frequency Synthesizers Theory and Design", Second Edition, by Vadim Manassewitsch, John Wiley and Sons, 1980. Such frequency sources are stabilized by quantum mechanical atomic state transition resonances such as the hyperfine atomic resonance frequency related to a change in the internal energy of the atom. A rubidium frequency standard operates as a discriminator based upon the energy absorption characteristic of rubidium-87. In practice, a rubidium lamp passes a light beam into a rubidium absorption cell. The rubidium cell absorbs some of the light energy because of the energy level transitions in the rubidium-87 gas. When an electromagnetic field of frequency equal to the resonance frequency of the rubidium vapor is applied to the vapor cell, the number of energy level transitions in the rubidium-87 gas is increased and more of the light emitted by the rubidium lamp is absorbed by the rubidium vapor cell. Typically, a photodiode is used to detect the occurrence of the maximum absorption of light from the rubidium lamp which occurs when the frequency of the excitation electromagnetic field exactly matches the rubidium resonance frequency. Typically, a frequency synthesizer is used to generate the appropriate electromagnetic field frequency of approximately 6,834.685 MHz. This field is modulated at a relatively slow rate (i.e., 154 Hz.) so that the photodiode provides a demodulated signal which may be applied to a phase detector or comparator which also receives the reference modulation signal. The output of the phase comparator is a DC error voltage which is used to control a voltage controlled crystal oscillator at a selected frequency, typically of 5 or 10 MHz. In this manner, the frequency of the crystal oscillator is stabilized to approximately one part in $10^{11}$ or better over long periods of time to provide a highly stable and accurate frequency source.

The elaborate design and complexity and commensurate costs for an atomic frequency standard for stabilizing a crystal oscillator would be for nought unless the oscillator itself were fairly stable to begin with. The oscillator should be relatively insensitive to temperature and mechanical effects and to variations in the load to which the crystal output is connected. In order to achieve this commensurate crystal oscillator stability and insensitivity in the prior art, it has been necessary to resort to elaborate electrical and mechanical means for isolating the crystal oscillator circuit to render it insensitive to physical and thermal shock. In addition, it has been necessary to use relatively expensive crystals which have a low effective series resistance and good aging characteristics. Unfortunately, such elaborate measures and expensive crystals substantially increase the design and production costs of the crystal oscillator and of the overall frequency standard system, and thus contribute significantly to the prohibitive costs typical for prior art atomic clock stabilized oscillators.

SUMMARY OF THE INVENTION

The voltage controlled crystal oscillator of the present invention combines a number of novel features rendering its frequency stability far less sensitive to temperature variations, mechanical vibration, and variations in load impedance while still permitting the use of relatively low cost components in a miniaturized rugged package that is especially adapted for use with an atomic clock such as a rubidium frequency standard.

More specifically, the present invention combines a novel field effect transistor oscillator configuration in which the oscillator output is derived through the crystal per se rather than from the typical transistor connection which would otherwise cause the generation of spurious outputs. In addition, power gain is achieved without changing the phase angle of the signal by also utilizing a bipolar emitter follower transistor to allow increased values of feedback capacitance to swamp out temperature sensitive transistor junction capacitance variations. The FET oscillator uses a gain leveling diode and bipolar emitter follower resulting in exceptional performance characteristics despite the use of relatively inexpensive crystals having high effective series resistance.

Another feature of the present invention is the use of a buffer/amplifier technique to increase the output level of the oscillator signal while isolating the crystal oscillator circuit from outside load variation. These advantageous result is achieved by utilizing a grounded gate FET cicuit and transformer coupling from a high impedance buffer amplifier to drive the output signal.

Another novel aspect of the present invention is the use of a resilient silicone based, cured thermal, foam material to enclose the crystal oscillator circuit and crystal oven to prevent vibrational shock sensitivity and to further reduce sensitivity to variations in temperature. The effects of the novel combination of frequency variation desensitizing features of the present invention obviates the prior art use of complex oscillator frequency control circuits which provide a fast controlled response to compensate for the aforementioned sensitivities which would otherwise cause perturbations in the output frequency. As a result, a considerable relaxation of the loop response requirement is achieved in the present invention thereby simplifying the circuit components and substantially reducing the costs and complexity of the oscillator.

OBJECTS

It is therefore a primary object of the present invention to provide a highly stable crystal controlled oscillator that overcomes and/or substantially reduces the aforementioned disadvantages of the prior art.

It is another object of the present invention to provide an improved controlled oscillator that employs a number of advantageous features rendering it highly stable in frequency as a result of reduced sensitivity to variations in load impedance and to both physical and thermal shock without requiring the use of the highest quality and therefore most expensive crystals.

It is still a further object of the present invention to provide a variable frequency crystal controlled oscillator that is particularly adapted for use as a frequency source stabilized by an atomic clock such as a rubidium frequency standard and which utilizes a number of novel features which render the oscillator more stable per se to thereby minimize the cost and complexity of the overall stabilized frequency source.

It is still a further object of the present invention to provide a highly stable voltage controlled crystal oscillator which employs a novel buffer/amplifier circuit including a grounded gate FET and transformer coupling of the oscillator output signal while still isolating the oscillator circuit from variations in the impedance of the load to which the oscillator is connected, thus desensitizing the oscillator frequency to such load variations.

It is still a further object of the present invention to provide a highly stabilized voltage controlled crystal oscillator employing a novel circuit in which the oscillator output is extracted through the crystal per se rather than typical transistor connections to provide an oscillator output signal that is relatively free of noise and spurious output signals and that has reduced sensitivity to temperature variations despite the selection of crystals over a broad range of quality and costs.

It is still a further object of the present invention to provide a highly stable voltage controlled crystal oscillator which employs a novel resilient, silicone based, cured thermal foam material as an enclosure to substantially reduce the sensitivity of the oscillator to thermal and mechanical shock thereby assuring a more stable output frequency.

BRIEF DESCRIPTION OF THE DRAWINGS

The aforementioned objects and advantages of the present invention, as well as additional objects and advantages thereof, will be more fully understood hereinafter as a result of the detailed description of the presently preferred embodiment of the invention when taken in conjunction with the accompanying drawings in which.

DETAILED DESCRIPTION OF A PREFERRED EMBODIMENT

Figure 1:
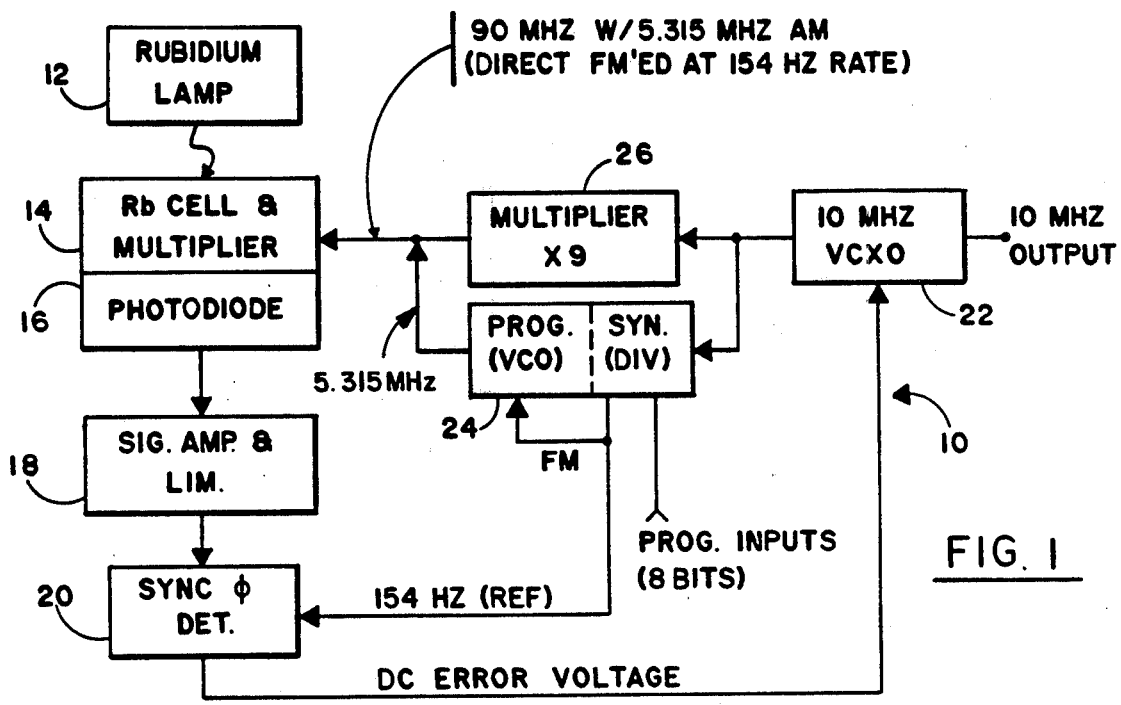
FIG. 1 is a simplified block diagram of a rubidium frequency standard with which the improved voltage controlled crystal oscillator of the present invention may be utilized.

Referring to FIG. 1 there is shown therein a simplified block diagram of a rubidium frequency standard 10 employing a voltage controlled crystal oscillator in accordance with the present invention. More specifically and as is well-known in the art, the rubidium standard 10 utilizes a rubidium lamp 12 to generate a beam of light. The light beam is directed through a rubidium vapor cell and multiplier 14 and is incident upon a photodiode 16. The output of the photodiode is connected to a signal amplifier and limiter 18 which is, in turn, connected to a synchronous phase detector 20. Synchronous phase detector 20 develops a DC error voltage which is applied to the voltage controlled crystal oscillator 22 of the invention to adjust the precise frequency thereof. Crystal oscillator 22 provides a nominal 10 MHz. output signal which is the externally accessible output of the rubidium frequency source 10. Crystal oscillator 22 also provides an output signal to a programmable frequency synthesizer 24 and to a X9 frequency multiplier 26. Synthesizer 24 generates a phase locked 154 Hz. periodic signal that is applied as a reference signal to synchronous phase detector 20 and which is also applied as a frequency modulating signal to a phase locked voltage controlled oscillator internal to the synthesizer. The output of this internal controlled oscillator is a periodic signal of approximately 5.315 MHz. which is summed with the 90 MHz. output signal of multiplier 26. That combination of signals is applied to rubidium cell and multiplier 14. The lower sideband of the 76th harmonic of the 90 MHz. signal output of multiplier 26, (amplitude modulated by the 5.315 MHz. output of the synthesizer), generated by the non-linear characteristics of a snap diode multiplier, corresponds to the approximate resonance frequency of the hyperfine atomic state transition of the rubidium cell.

As is well-known in the art to which the present invention pertains, when the frequency of the applied electromagnetic field matches the resonance frequency of the rubidium cell, the maximum number of energy transitions occur and the maximum absorption of rubidium-87 light is produced in the rubidium cell. Accordingly, the effect of the 154 Hz. frequency modulation of the lower sideband of the 90 MHz. output of multiplier 26, amplitude modulated by the 5.315 MHz. output of synthesizer 24, is a photodiode output signal which is composed of a combination of a 154 Hz. fundamental frequency and a second harmonic at a frequency of 308 Hz. As is well-known in the art, when the resonance frequency of the rubidium cell is matched precisely by the frequency of the applied electromagnetic radiation, the fundamental modulation frequency of 154 Hz. is, in effect, zeroed out and only the 308 Hz. second harmonic remains. On the other hand, if precise matching of the frequency of electromagnetic radiation and the resonance frequency of the cell is not achieved, the fundamental modulation frequency at 154 Hz. is produced by the photodiode, with a phase dependent upon whether the frequency of the applied electromagnetic radiation is above or below the resonance frequency of the cell. The photodiode output signal is applied to the signal amplifier and limiter 18 and thereafter to synchronous phase detector 20. Detector 20 compares the photodiode output with a 154 Hz. reference signal derived from frequency synthesizer 24. The detector thus provides a DC error voltage the magnitude of which may be used to accurately track the frequency of the voltage controlled crystal oscillator 22 to the resonance frequency of the rubidium cell.

As further indicated in FIG. 1, programmable frequency synthesizer 24 includes provision for programmable inputs comprising 8 bits of binary code for controlling the frequency thereof. Furthermore, the synthesizer provides the 154 Hz. reference signal to synchronous phase detector 20 to develop the DC error signal that is applied to the crystal oscillator 22.

Figure 2:
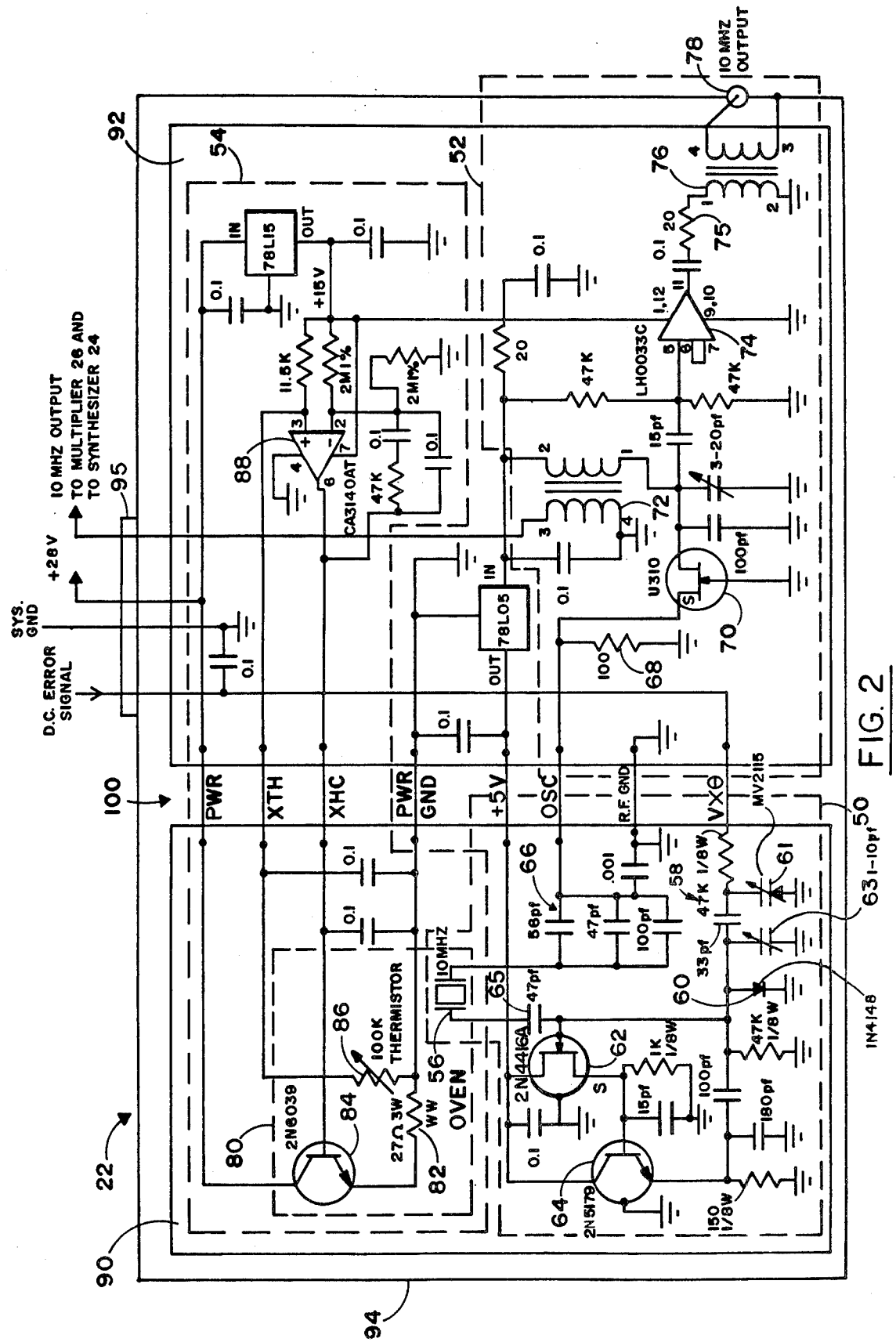
FIG. 2 is a detailed schematic diagram of the crystal oscillator of the present invention illustrating the electrical innovations employed therein.

Referring now to FIG. 2 which comprises a detailed schematic drawing of the oscillator 22 of the invention, it will be observed by those having skill in the art to which the present invention pertains that the oscillator circuit may be considered to comprise three main sections, namely, a crystal oscillator section 50, a buffer/amplifier section 52, and a temperature control setion 54 with 10 MHz. crystal 56 actually falling within both sections 50 and 54 by virtue of its electrical connection to the circuit of 50 and its physical interaction with the temperature control section 54. In operation the DC error signal derived from synchronous phase detector 20 of FIG. 1 is applied to an RC network 58 in the feedback loop of oscillator 50 which is of the Colpitts type. Network 58 includes a gain leveling diode 60 and a variable capacitor 61, the latter being responsive to the magnitude of the DC error signal to control the fine variation in feedback capacitance and thus the fine frequency of oscillator 50. The active element of oscillator 50 is a field effect transistor (FET) 62 to which RC network 58 is connected at the gate terminal thereof. The source terminal of FET 62 is connected to the base of emitter follower configured transistor 64 which provides power gain to the output of FET 62 without changing its phase angle signal. This power gain without phase angle variation permits the use of greater feedback capacitance in oscillator 50 to, in effect, "swamp out" temperature sensitive transistor junction capacitance variations. Also connected to the gate terminal of FET 62 is capacitor 65 in series connection with crystal 56 and capacitor network 66 which also form part of the feedback path of the oscillator. By using an FET oscillator with a gain leveling diode as an AGC device and a bipolar emitter follower for high signal level, exceptional performance is obtained. The circuit is readily configured for frequency adjustment with control of varicap 61 and crystals having a relatively high effective series resistance can be tolerated. In addition, crystal drive is easily controlled and no tuned circuits are required. Unlike conventional Colpitts oscillators where the oscillator output is commonly derived from the FET terminal directly, in the present invention the oscillator output is derived through crystal 56 and network 66. This novel means for deriving the oscillator output significantly reduces the large scale characteristics of the oscillator transistor which would otherwise cause spurious output signals. This also provides superior harmonic suppression because the crystal acts as its own low pass filter.

The oscillator output signal (OSC) is applied to buffer amplifier section 52 of the invention. The specific purpose of buffer amplifier 52 is to increase the output level of the crystal oscillator to a useable value for driving the frequency multiplier and synthesizer 26 and 24, respectively (see FIG. 1), and for providing the output signal to the end user of the crystal oscillator of the invention. This has to be accomplished without permitting outside load variations to cause any significant level changes to the multiplier circuit or pulling of the crystal oscillator causing loop control frequency perturbations. The crystal oscillator has an output signal, OSC, at a low voltage level (approximately 200 millivolts peak to peak) and has a low output impedance. It is applied to a grounded gate FET 70 and a 100 Ohm source bias resistor 68. Resistor 68 is in parallel with the equivalent source impedance of FET 70 and provides approximately a 50 Ohm termination impedance to the oscillator signal. The gate of FET 70 is internally connected to the case of the transistor thereby isolating the drain circuit. The amplified output of the oscillator signal OSC at the drain terminal of FET 70 is applied both to a coupling transformer 72 and to a high input impedance buffer/amplifier 74. The secondary winding of coupling transformer 72 provides the 10 MHz. output signal to multiplier 26 and to synthesizer 24 as previously described in conjunction with FIG. 1. The other 10 MHz. output available externally to the user is capacitively coupled from the drain terminal of FET 70 to buffer/amplifier 74, the output of which is current limited by a resistor 75 and then applied to the primary winding of a coupling transformer 76. The secondary winding of transformer 76 provides the 10 MHz. output signal to an externally accessible plug 78. In addition to providing isolation to variations in the load impedance to which plug 78 is connected, coupling transformer 76 also inhibits potential ground loops.

Temperature control section 54 includes an oven 80 in which 10 MHz. crystal 56 is located for temperature control, preferably at the crystal turning point for optimum stability. Heating is achieved by passing current through a 27 Ohm, 3 watt wire wound resistor 82 which is in the emitter circuit of transistor 84. The temperature is monitored by thermistor 86 which is connected to a positive input terminal to amplifier 88, the output of which is connected to the base terminal of transistor 84. Thus, heating resistor 82, transistor 84, thermistor 86 and amplifier 88 form a feedback control loop for controlling the temperature within oven 80 for precise frequency stability of oscillator 22.

Oscillator section 50, as well as all of the components within temperature control section 54 that are located within oven 80, are mounted on a common circuit board 90. The components of buffer/amplifier 52 and the remaining components of temperature control section 54 are mounted on a second common circuit board 92. Circuit boards 90 and 92 are interconnected by a wire harness 100. Both circuit boards are enclosed within an outer casing 94 with plugs 78 and 95 providing the only access needed for interconnection between oscillator 22 and the remaining elements of the rubidium frequency standard 10 as previously described in conjunction with FIG. 1.

Figure 5:
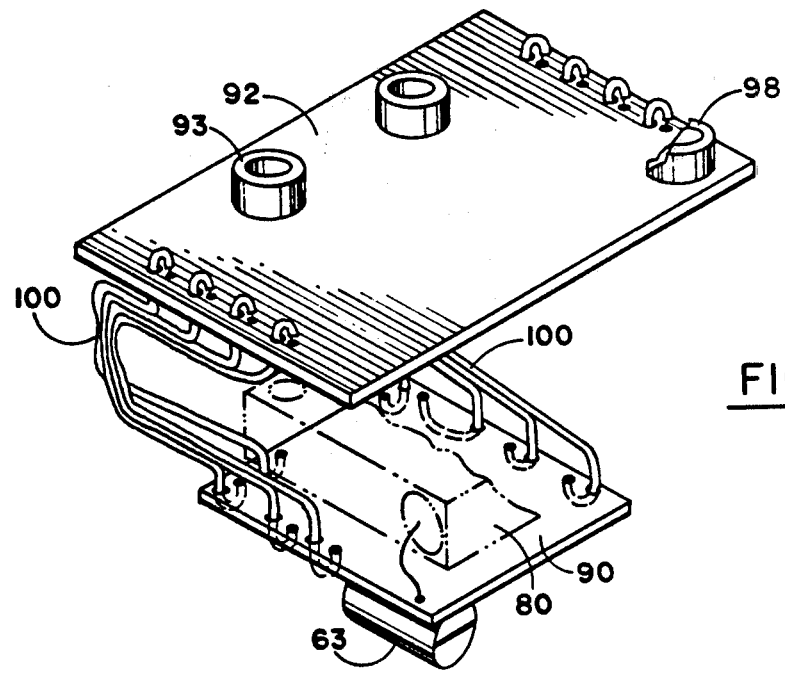
FIG. 5 is an enlarged three-dimensional view of the interior physical packaging configuration of the invention.
Figure 3:
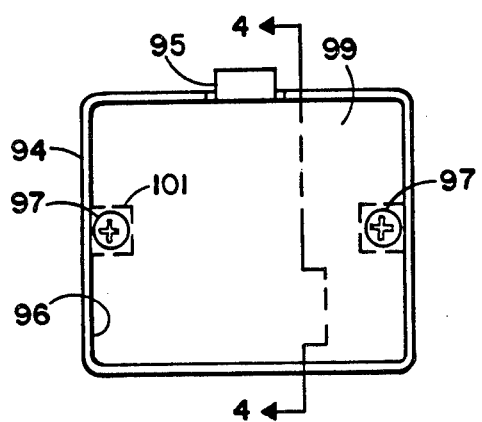
FIG. 3 is a plan view of a mechanical package configuration in which a preferred embodiment of the invention may be housed.
Figure 4:
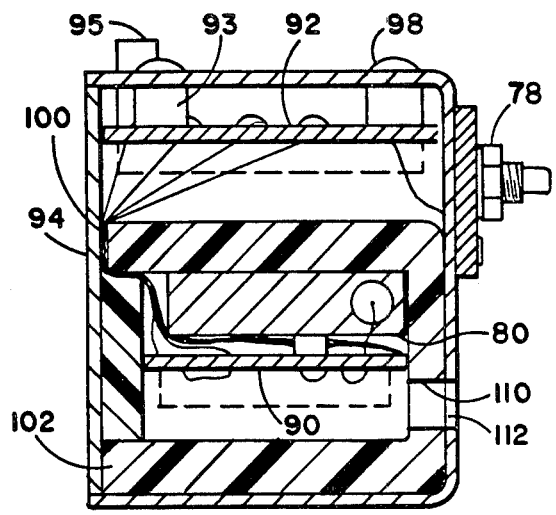
FIG. 4 is a sectional view of the interior of the package configuration of FIG. 3 taken along lines 4—4 of FIG. 3.
Figure 7:
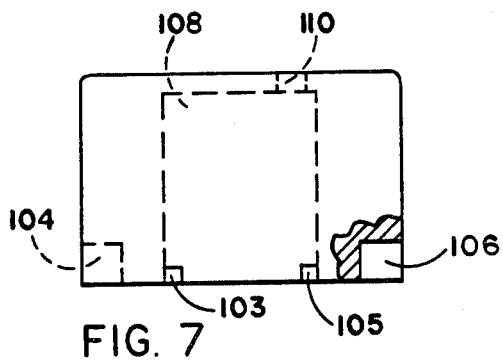
FIGS. 7 and 8 are top and front plan views respectively of the foam material illustrated in FIG. 6.
Figure 6:
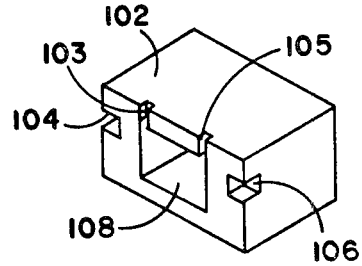
FIG. 6 is a three-dimensional view of a resilient thermal cured foam material employed within the physical structure of the invention.
Figure 8:
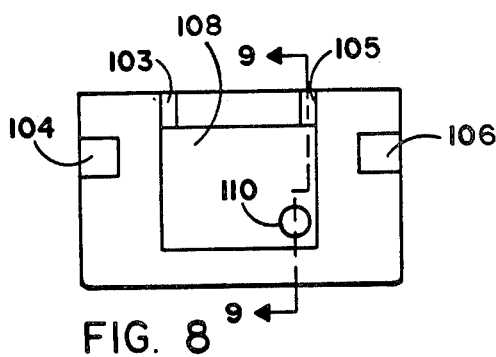
Figure 9:
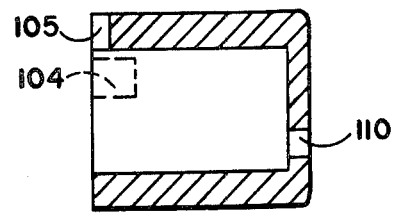
FIG. 9 is a sectional view of the foam material of FIG. 6 taken along lines 9—9 of FIG. 8.

The physical layout of the oscillator of the present invention will now be disclosed in more detail in conjunction with FIGS. 3, 4 and 5. More specifically, in FIGS. 3 and 4 it is seen that the outer casing 94 is a substantially rectangular configured housing having a rectangular aperture 96 on the front thereof which is enclosed by a rectangular cover plate 99 secured to casing 94 by a pair of screws 97. Plug 95 extends from the top of casing 94 and plug 78 extends from the rear thereof. In the sectional view of FIG. 4 it is seen that the circuit board 92 is secured to the top surface of casing 94 by a plurality of screws 98 with a corresponding plurality of stand-offs 93 providing the appropriate spacing between circuit board 92 and the top of casing 94. Circuit board 90, including oven 80 mounted thereto in spaced relation, is mounted within casing 94 parallel to and below circuit board 92. Circuit board 90 is connected to circuit board 92 by means of wire harness 100 which as seen best in FIG. 5 is divided into two groups of cables on opposite sides of circuit board 90. As also shown in FIG. 5, respective portions of wire harness 100 are pinched together to accommodate rectangular configured thermal foam material 102 which substantially surrounds circuit board 90 and oven 80.

FIGS. 6 through 9 illustrate the mechanical details of resilient thermal foam material 102 of the preferred embodiment herein. More specifically, it is seen that thermal foam material 102 is of substantially rectangular shape including a pair of slots 103 and 105, a pair of corner notches 104 and 106, a rectangular aperture 108 and a circular aperture 110 leading from the exterior rear portion of material 102 to the interior rectangular aperture 108. Slots 103 and 105 provide unobstructed paths for wire harness 100 interconnecting printed circuit board 92 outside foam material 102 and printed circuit board 90 within aperture 108 of foam material 102. Corner notches 104 and 106 provide unobstructed spaces for apertured flanges 101 within casing 94 to receive screws 97 for securing the cover plate 99 thereto. Circular aperture 110 is aligned with a corresponding aperture 112 in the rear wall of casing 94 providing access to variable capacitor 63 mounted to the bottom surface of printed circuit board 90 to provide means for precise frequency adjustment of oscillator 22. This frequency adjustment may be employed to compensate for long term aging when such aging would otherwise pull the frequency of oscillator 22 outside the control range of the DC error voltage (see FIG. 1).

Thermal resilient foam material 102 is preferably a silicone based foam material cured at room temperature to provide both thermal and vibrational shock resistance to the oscillator and oven circuits of the invention mounted on circuit board 90.

It will now be understood that what has been disclosed herein is a novel voltage controlled crystal oscillator especially suitable for use in conjunction with an atomic clock such as a rubidium frequency standard as a stabilized frequency source controlled thereby. A number of novel features of the preferred embodiment have been disclosed herein including the use of a buffer-/amplifier circuit to increase oscillator output and to isolate the oscillator from outside load variations to prevent frequency instability as a result thereof; and a novel oscillator circuit including a FET based Colpitts oscillator employing a bipolar emitter follower for power gain without phase shift and in which the oscillator output is derived through the crystal per se which acts as its own low pass filter to reduce spurious outputs and noise. The novel oscillator circuit of the present invention improves frequency stability by precluding sensitivity to temperature effects on transistor junction capacitance such as is common in the prior art. The inventive circuit disclosed herein permits the use of lower cost crystals having higher effective series resistance thereby decreasing the overall cost and complexity of the oscillator. Also disclosed herein is the novel use of a resilient, silicone based, cured thermal foam material used to enclose the crystal oscillator circuit and oven to further reduce the oscillator's temperature sensitivity and to also provide shock and vibration resistance.

Although a particular preferred embodiment of the invention has been disclosed herein, those having skill in the art to which the present invention pertains will understand that numerous modifications and additions to the present invention may be made without deviating from the scope of the invention. By way of example, variations may be made to the electrical components and physical characteristics of the invention to provide alternative frequencies, signal levels, temperatures and physical configurations not specifically disclosed herein. However, it will be understood that all such modifications and additions are currently contemplated to be within the scope of the present invention which is to be limited only by the appended claims.

I claim:

1. An improved crystal oscillator of the type having an amplifier and a feedback circuit, at least one element of the feedback circuit being a piezo-electric crystal of material and geometry suitable for presenting an equivalent reactive impedance for causing oscillations at a selected frequency in the amplifier, the improvement comprising:

a connection from a first terminal of said crystal, through a suitable capacitor to an amplifier input and the oscillator output being derived from a second terminal of said crystal through a suitable coupling network, whereby said crystal acts as a low pass filter in said oscillator output to suppress harmonics of said selected frequency and frequency standard means for receiving a signal from said oscillator output for comparing said signal to a reference signal to generate an error signal to be applied to control the frequency of said oscillator.

2. The improved crystal oscillator of claim 1 wherein said amplifier comprises a field effect transistor the gate terminal of which is said amplifier input and the source terminal of which supplies power to the amplifier output.

3. The improved crystal oscillator of claim 2 further comprising a bipolar transistor configured as an emitter follower, the base terminal of which is connected to said source terminal of said field effect transistor and the emitter terminal of which provides power gain at zero phase shift to said crystal to develop said oscillator output.

4. The improved crystal oscillator of claim 1 wherein said oscillator output is connected to a buffer amplifier circuit for isolating said oscillator output from extreme variations in load impedance, the buffer amplifier circuit comprising:

a grounded gate field effect transistor having a source-to-ground resistor which, in combination with the equivalent input impedance of said grounded gate field effect transistor, provides a matching termination impedance to said oscillator output at said selected frequency.

5. The improved crystal oscillator of claim 4 wherein said buffer amplifier circuit further comprises:

a high input impedance amplifier having an input and an output, the input thereof being capacitively coupled to the drain terminal of said grounded gate field effect transistor and the output thereof being connected in series with a current limiting resistor and the primary winding of a transformer, the secondary winding of said transformer providing an amplified and isolated output signal of frequency equal to the frequency of said oscillator output.

6. The improved crystal oscillator of claim 1 further commprising a temperature controlled oven enclosing at least said piezo-electric crystal for stabilizing the operating temperature of said crystal.

7. The improved crystal oscillator of claim 6 further comprising:
a resilient, thermal insulating, shock absorbing material substantially enclosing at least said amplifier, said feedback circuit, said crystal and said oven for decreasing the sensitivity of said crystal oscillator to thermal and mechanical shock.

8. In an atomic frequency standard of the type used for stabilizing a frequency source by tracking it to a hyperfine transition resonance of an atomic frequency resonator having a photodiode for detecting resonance, a phase detector for generating a control signal in response to the photodiode output signal and a reference signal, a voltage controlled crystal oscillator frequency source having an output signal of frequency controlled by the control signal of the phase detector, and means interconnecting the output signal of the frequency source and the resonator for generating an electromagnetic field for application to the resonator with a field frequency dependent on the frequency of the frequency source and for generating the reference signal, the interconnecting means comprising a frequency multiplier and an adjustable frequency synthesizer,
the crystal oscillator frequency source having: an amplifier and a reactive feedback circuit, the improvement comprising: in said reactive feedback circuit, a suitable capacitor;
and a piezo-electric crystal having first and second terminals, the first terminal being connected to an input of the amplifier through the capacitor and the frequency source output being derived from the second terminal of said crystal through a suitable coupling network, whereby said crystal acts as a low pass filter in said frequency source output to suppress harmonics of said selected frequency.

9. In the atomic frequency standard of claim 8 wherein said amplifier comprises a field effect transistor the gate terminal of which is said amplifier input and the source terminal of which supplies power to the amplifier output.

10. In the atomic frequency standard of claim 9 wherein said amplifier further comprises a bipolar transistor configured as an emitter follower, the base terminal of which is connected to said source terminal of said field effect transistor and the emitter terminal of which provides power gain at zero phase shift to said crystal to develop said oscillator output.

11. In the atomic frequency standard of claim 8 wherein said output signal is connected to a buffer amplifier circuit for isolating said oscillator output from extreme variations in load impedance, the buffer amplifier circuit comprising:
a grounded gate field effect transistor having a source-to-ground resistor which, in combination with the equivalent input impedance of said grounded gate field effect transistor, provides a matching termination impedance to said oscillator output at said selected frequency.

12. In the atomic frequency standard of claim 11 wherein said buffer amplifier circuit further comprises:
a high input impedance amplifier having an input and an output, the input thereof being capacitively coupled to the drain terminal of said grounded gate field effect transistor and the output thereof being connected in series with a current limiting resistor and the primary winding of a transformer, the secondary winding of the transformer providing an amplified and isolated output signal of frequency equal to the frequency of said oscillator output.

13. In the atomic frequency standard of claim 8 further comprising a temperature controlled oven enclosing at least said piezo-electric crystal for stabilizing the operating temperature of said crystal.

14. In the atomic frequency standard of claim 13 further comprising:
a resilient, thermal insulating, shock absorbing material substantially enclosing at least said amplifier, said feedback circuit, said crystal and said oven for decreasing the sensitivity of said crystal oscillator to thermal and mechanical shock.

15. An improved crystal oscillator comprising:
an amplifier;
a reactive amplifier feedback circuit;
a capacitor connected to said amplifier input;
a piezo-electric crystal of material and geometry suitable for presenting an equivalent reactive impedance for promoting oscillations at a selected frequency, said crystal having two connecting terminals, one being connected to said amplifier input, through said capacitor, the oscillator output being derived from the other terminal of said crystal through a suitable coupling network, whereby said crystal acts as a low pass filter in said oscillator output to suppress harmonics of said selected frequency;
and frequency standard means for receiving said oscillator output for comparing said oscillator output to a reference signal to generate an error signal to be applied to the feedback circuit to control the frequency of said oscillator.

16. An atomic frequency standard of the type used for stabilizing a frequency source by tracking it to a hyperfine transition resonance of an atomic frequency resonator having a photodiode for detecting resonance, a phase detector for generating an oscillator control signal in response to the photodiode output signal and a reference signal, a voltage controlled crystal oscillator frequency source having an output signal of frequency controlled by the control signal of the phase detector, and means interconnecting the frequency source and the resonator for generating an electromagnetic field for application to the resonator with a field frequency dependent on the frequency of the frequency source and for generating the reference signal, the interconnecting means comprising a frequency multiplier and an adjustable frequency synthesizer, said frequency source comprising:
an amplifier;
first and second capacitance means connected to an input of said amplifier;
the control signal of the phase detector being conducted to said first capacitance means;
a frequency source feedback circuit comprising at least said first capacitance means connected to cause said amplifier to oscillate at a selected frequency;
and
a piezo-electric crystal, the crystal being connected at one terminal to the input of the amplifier through said second capacitance means and the frequency source output being derived from the other terminal of said crystal through a suitable coupling network, whereby said crystal acts as a low pass filter in said frequency source output to suppress harmonics of said selected frequency.

* * * * *